US008941180B2

(12) United States Patent
Anderson et al.

(10) Patent No.: US 8,941,180 B2
(45) Date of Patent: Jan. 27, 2015

(54) INTEGRATED CIRCUIT STRUCTURE INCORPORATING ONE OR MORE ASYMMETRIC FIELD EFFECT TRANSISTORS AS POWER GATES FOR AN ELECTRONIC CIRCUIT WITH STACKED SYMMETRIC FIELD EFFECT TRANSISTORS

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 463 days.

(21) Appl. No.: 13/044,872

(22) Filed: Mar. 10, 2011

(65) Prior Publication Data
US 2012/0228709 A1 Sep. 13, 2012

(51) Int. Cl.
*H01L 27/02* (2006.01)
*H01L 27/12* (2006.01)
*H01L 21/8234* (2006.01)
(Continued)

(52) U.S. Cl.
CPC .... *H01L 27/1203* (2013.01); *H01L 21/823412* (2013.01); *H01L 21/823418* (2013.01); *H01L 29/78624* (2013.01); *H01L 21/823807* (2013.01); *H01L 21/823814* (2013.01)
USPC .................................. 257/348; 257/E29.273

(58) Field of Classification Search
CPC ............ H01L 29/7835; H01L 29/0878; H01L 29/66492; H01L 29/66659; H01L 29/78621; H01L 29/78624
USPC .......... 365/154, 188, 190; 257/225, 235, 348, 257/369, E29.273, E27.062, 355, E27.061, 257/E29.255
See application file for complete search history.

(56) References Cited

U.S. PATENT DOCUMENTS 5,874,836 A   2/1999 Nowak et al.
6,031,268 A * 2/2000 Hiroki et al. .................. 257/345
(Continued)

OTHER PUBLICATIONS

Lo et al., "Power-Gating Schemes for Ultra-Thin SOI (UTSOI) Circuits in Hybrid SOI-Epitaxial CMOS Structures" VLSI Design, Automation and Test, 2006 International Symposium on Apr. 26-28, 2006, pp. 1-2; Current Version Published: Dec. 11, 2006.
(Continued)

*Primary Examiner* — Wael Fahmy
*Assistant Examiner* — Sarah Salerno
(74) *Attorney, Agent, or Firm* — Gibb & Riley, LLC; Michael J. LeStrange, Esq.

(57) ABSTRACT

Disclosed is an integrated circuit having an asymmetric FET as a power gate for an electronic circuit, which has at least two stacked symmetric field effect transistors. The asymmetric FET has an asymmetric halo configuration (i.e., a single source-side halo or a source-side halo with a higher dopant concentration than a drain-side halo) and an asymmetric source/drain extension configuration (i.e., the source extension can be overlapped to a greater extent by the gate structure than the drain extension and/or the source extension can have a higher dopant concentration than the drain extension). As a result, the asymmetric FET has a low off current. In operation, the asymmetric FET is turned off when the electronic circuit is placed in a standby state and, due to the low off current (Ioff), effectively reduces standby leakage current from the electronic circuit. Additionally, avoiding the use of stacked asymmetric field effect transistors within the electronic circuit itself prevents performance degradation due to reduced linear drain current (Idlin).

20 Claims, 5 Drawing Sheets 121 or 122

(51) Int. Cl.
*H01L 29/786* (2006.01)
*H01L 21/8238* (2006.01)

(56) References Cited

U.S. PATENT DOCUMENTS

| | | | |
|---|---|---|---|
| 6,429,689 | B1 | 8/2002 | Allen et al. |
| 6,552,601 | B1* | 4/2003 | Burr ............................. 327/537 |
| 6,707,721 | B2 | 3/2004 | Singh et al. |
| 6,859,071 | B2 | 2/2005 | Tierno et al. |
| 7,088,131 | B1 | 8/2006 | Stout et al. |
| 7,230,455 | B2 | 6/2007 | Luk |
| 7,342,287 | B2 | 3/2008 | Chuang et al. |
| 7,391,233 | B1 | 6/2008 | Bose et al. |
| 7,417,837 | B2 | 8/2008 | Chen |
| 7,436,696 | B2* | 10/2008 | Wang et al. ................... 365/154 |
| 7,609,107 | B2 | 10/2009 | Tanaka |
| 7,813,162 | B2 | 10/2010 | Zhu et al. |
| 2005/0040881 | A1 | 2/2005 | Brown et al. |
| 2007/0165343 | A1 | 7/2007 | Barowski et al. |
| 2007/0253239 | A1* | 11/2007 | Wang et al. ................... 365/154 |
| 2007/0253839 | A1* | 11/2007 | Higashihara .................. 417/317 |
| 2008/0143431 | A1 | 6/2008 | Bhattacharya |
| 2008/0195987 | A1 | 8/2008 | Bernstein et al. |
| 2009/0302929 | A1 | 12/2009 | Chuang et al. |
| 2011/0261629 | A1* | 10/2011 | Seshadri et al. ......... 365/189.09 |

OTHER PUBLICATIONS

Chuang et al.,"High-Performance SRAM in Nanoscale CMOS: Design Challenges and Techniques", Memory Technology, Design and Testing, 2007. MTDT 2007. IEEE International Workshop on Publication Year: 2007, pp. 4-12.

Kim et al., "Double-Gate CMOS: Symmetrical-Versus Asymmetrical-Gate Devices", Electron Devices, IEEE Transactions on Volume: 48, Issue: 2, Publication Year: 2001, pp. 294-299.

IBM, "Gated Direct Read of Dynamic Random Access Memory Cells Using High Transfer Ratio", IPCOM000190075D, Nov. 16, 2009, 4 pages.

IBM, "Wave Pipeline Leakage Power Saving Scheme for Digital Circuits", IPCOM000180426D, Mar. 9, 2009, 3 pages.

* cited by examiner

INTEGRATED CIRCUIT STRUCTURE INCORPORATING ONE OR MORE ASYMMETRIC FIELD EFFECT TRANSISTORS AS POWER GATES FOR AN ELECTRONIC CIRCUIT WITH STACKED SYMMETRIC FIELD EFFECT TRANSISTORS

BACKGROUND

1. Field of the Invention

The present invention relates to integrated circuit structures and, more particularly, to embodiments of an integrated circuit structure that incorporates one or more asymmetric field effect transistors as a power gates (e.g., a footer and/or a header) for an electronic circuit with stacked symmetric field effect transistors.

2. Description of the Related Art

Generally, integrated circuit structures are designed with the following goals in mind: (1) decreasing device size; (2) increasing device performance (e.g., by increasing switching speed) and (3) decreasing power consumption. Device size scaling can lead to a corresponding decrease in device channel lengths and, thereby a corresponding increase in switching speed. However, it has been determined that device size scaling has its limits because short channel lengths can also lead to a number of undesirable "short-channel effects". These short-channel effects include, but are not limited, a reduction in threshold voltage (Vt), an increase in drain leakage current, punch through (i.e., diffusion of dopants from the source and drain into the channel), and drain induced barrier lowering (DIBL). To reduce or overcome such short-channel effects without reducing switching speed, asymmetric field effect transistors have been developed. Unfortunately, there are disadvantages associated with stacking such asymmetric field effect transistors.

SUMMARY

In view of the foregoing disclosed herein are embodiments of an integrated circuit structure that incorporates both asymmetric and symmetric field effect transistors, balancing the advantages and disadvantages of both in order to optimize overall integrated circuit performance. Specifically, the embodiments incorporate one or more asymmetric field effect transistors as power gates (i.e., as a footer and/or a header) for an electronic circuit (e.g., for a logic circuit, such as a NAND circuit or a NOR circuit, for an input/output buffer circuit, etc.), which has at least two stacked symmetric field effect transistors. The asymmetric field effect transistor has an asymmetric halo configuration (i.e., a single source-side halo only or a source-side halo with a higher dopant concentration than a drain-side halo) and an asymmetric source/drain extension configuration (i.e., the source extension can be overlapped to a greater extent by the gate structure than the drain extension and/or the source extension can have a higher dopant concentration than the drain extension). As a result, the asymmetric field effect transistor has a low off current (i.e., Ioff). In operation as a power gate, the asymmetric field effect transistor is turned off when the electronic circuit is placed in a standby state and, due to the low off current (Ioff), effectively reduces standby leakage current from the electronic circuit. Additionally, avoiding the use of stacked asymmetric field effect transistors within the electronic circuit itself prevents performance degradation due to reduced linear drain current (Idlin).

Generally, the embodiments of the integrated circuit structure disclosed herein comprise at least an electronic circuit, a supply voltage for supplying power to the electronic circuit and an asymmetric field effect transistor for gating the supply of power to the electronic circuit.

Specifically, the asymmetric field effect transistor can comprise a source, a drain, a channel positioned laterally between the source and drain and a gate structure positioned above the channel. The asymmetric field effect transistor can further comprise a source extension extending laterally from the source towards the channel and, on the opposite side of the channel, a drain extension extending laterally from the drain towards the channel. The asymmetric field effect transistor can be asymmetric with respect to halo configuration. That is, the asymmetric field effect transistor can have a single halo positioned laterally between the source and the channel or, alternatively, can have a first halo positioned laterally between the source and the channel region and a second halo positioned laterally between the drain and said channel region, where the first halo has a higher dopant concentration than the second halo. The asymmetric field effect transistor can also be asymmetric with respect to source/drain extension configuration. That is, the source extension can be overlapped to a greater extent by the gate structure than the drain extension (i.e., the gate structure can overlap the source extension by a greater distance than the drain extension) and/or the source extension can have a higher dopant concentration than the drain extension.

The electronic circuit can comprise any electronic circuit having an output node and a plurality of symmetric field effect transistors, where at least two of are connected in series and have the same conductivity type as the asymmetric field effect transistor. The source of the asymmetric field effect transistor can be electrically connected to the supply voltage and the series-connected symmetric field effect transistors can be electrically connected between the drain of the asymmetric field effect transistor and the output node.

One exemplary embodiment of this integrated circuit structure can comprise at least an electronic circuit, a negative supply voltage (Vss) for supply power to the electronic circuit, and an N-type asymmetric field effect transistor for gating the supply of power to the electronic circuit.

Specifically, the N-type asymmetric field effect transistor can comprise a source, a drain, a channel positioned laterally between the source and drain and a gate structure positioned above the channel. The N-type asymmetric field effect transistor can comprise a source extension extending laterally from the source towards the channel and, on the opposite side of the channel, a drain extension extending laterally from the drain towards the channel. The N-type asymmetric field effect transistor can be asymmetric with respect halo configuration. That is, the N-type asymmetric field effect transistor can have a single halo positioned laterally between the source and the channel or, alternatively, can have a first halo positioned laterally between the source and the channel region and a second halo positioned laterally between the drain and said channel region, where the first halo has a higher dopant concentration than the second halo. The N-type asymmetric field effect transistor can also asymmetric with respect to source/drain extension configuration. That is, the source extension can be overlapped to a greater extent by the gate structure than the drain extension (i.e., the gate structure can overlap the source extension by a greater distance than the drain extension) and/or the source extension can have a higher dopant concentration than the drain extension.

In this case, the electronic circuit can comprise any electronic circuit (e.g., a logic circuit, such as a NAND circuit) having an output node and a plurality of symmetric field effect transistors, where at least two of the symmetric field effect transistors are N-type and connected in series. The source of the N-type asymmetric field effect transistor can be electrically connected to the negative supply voltage (Vss) and the N-type series-connected symmetric field effect transistors can be electrically connected between the drain of the N-type asymmetric field effect transistor and the output node.

Another exemplary embodiment of this integrated circuit structure can comprise at least an electronic circuit, a positive supply voltage (Vdd) for supply power to the electronic circuit, and a P-type asymmetric field effect transistor for gating the supply of power to the electronic circuit.

Specifically, the P-type asymmetric field effect transistor can comprise a source, a drain, a channel positioned laterally between the source and the drain and a gate structure positioned above the channel. The P-type asymmetric field effect transistor can further comprise a source extension extending laterally from the source towards the channel and, on the opposite side of the channel, a drain extension extending laterally from the drain towards the channel. The P-type asymmetric field effect transistor can be asymmetric with respect halo configuration. That is, the P-type asymmetric field effect transistor can have a single halo positioned laterally between the source and the channel or, alternatively, can have a first halo positioned laterally between the source and the channel region and a second halo positioned laterally between the drain and said channel region, where the first halo has a higher dopant concentration than the second halo. The P-type asymmetric field effect transistor can also be asymmetric with respect to source/drain extension configuration. That is, the source extension can be overlapped to a greater extent by the gate structure than the drain extension (i.e., the gate structure can overlap the source extension by a greater distance than the drain extension) and/or the source extension can have a higher dopant concentration than the drain extension.

In this case, the electronic circuit can comprise any electronic circuit (e.g., a logic circuit, such as a NOR circuit) having an output node and a plurality of symmetric field effect transistors, where at least two of the symmetric field effect transistors are P-type and connected in series. The source of the P-type asymmetric field effect transistor can be electrically connected to the positive supply voltage (Vdd) and the P-type series-connected symmetric field effect transistors can be electrically connected between the drain of the P-type asymmetric field effect transistor and the output node.

Yet another exemplary embodiment of this integrated circuit structure can comprise at least an electronic circuit, a positive supply voltage (Vdd) and a negative supply voltage (Vss) for supply power to the electronic circuit, and a P-type asymmetric field effect transistor and an N-type asymmetric field effect transistor for gating the supply of power to the electronic circuit. Specifically, the P-type and the N-type asymmetric field effect transistors can be configured in the same manner as the P-type and N-type field effect transistors, described in the embodiments above.

In this case, the electronic circuit can comprise any electronic circuit (e.g., an input/output buffer circuit) having an output node and a plurality of symmetric field effect transistors, where at least two are P-type and connected in series and at least two are N-type and connected in series. The source of the P-type asymmetric field effect transistor can be electrically connected to the positive supply voltage (Vdd) and the P-type series-connected symmetric field effect transistors can be electrically connected between the drain of the P-type asymmetric field effect transistor and the output node. Similarly, the source of the N-type asymmetric field effect transistor can be electrically connected to the negative supply voltage (Vss) and the N-type series-connected symmetric field effect transistors can be electrically connected between the drain of the N-type asymmetric field effect transistor and the output node.

BRIEF DESCRIPTION OF THE SEVERAL VIEWS OF THE DRAWINGS

The embodiments disclosed herein will be better understood with reference to the drawings, which are not necessarily drawn to scale and in which.

DETAILED DESCRIPTION

Figure 1:
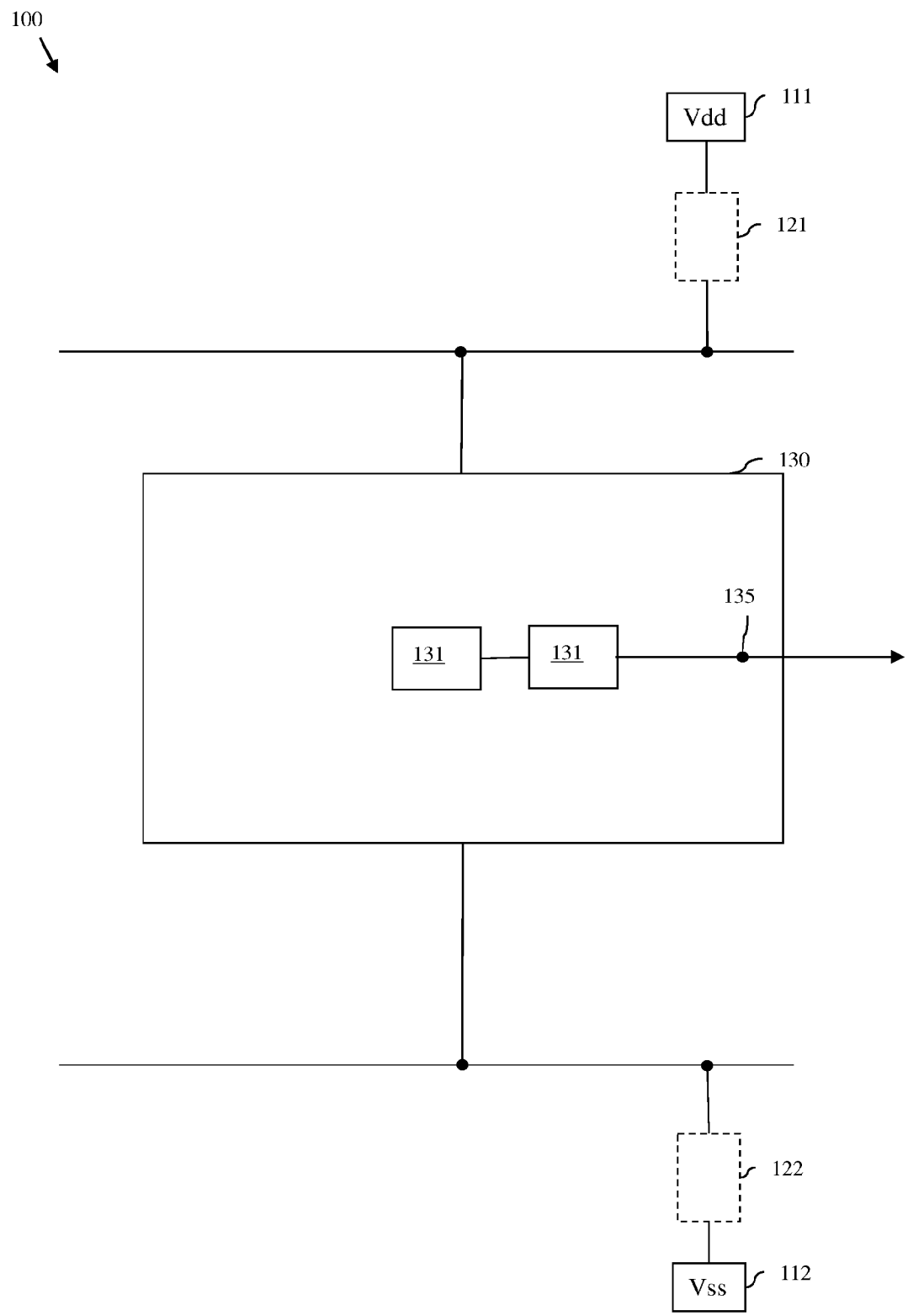
FIG. 1 is a schematic diagram illustrating generally embodiments of an integrated circuit structure according to the present invention.

The embodiments of the invention and the various features and advantageous details thereof are explained more fully with reference to the non-limiting embodiments that are illustrated in the accompanying drawings and detailed in the following description.

Generally, integrated circuit structures are designed with the following goals in mind: (1) decreasing device size; (2) increasing device performance (e.g., by increasing switching speed) and (3) decreasing power consumption. Device size scaling can lead to a corresponding decrease in device channel lengths and, thereby a corresponding increase in switching speed. However, it has been determined that device size scaling has its limits because short channel lengths can also lead to a number of undesirable "short-channel effects". These short-channel effects include, but are not limited, a reduction in threshold voltage (Vt), an increase in drain leakage current, punch through (i.e., diffusion of dopants from the source and drain into the channel), and drain induced barrier lowering (DIBL).

To overcome or at least reduce such short-channel effects, halos can be incorporated into field effect transistor structures. Specifically, halos are highly doped regions, which have the same conductivity type as the field effect transistor body and which are positioned on each side of the channel (i.e., on the source-side and the drain-side of the channel) at the interfaces with the source and drain, respectively. These halos reduce the presence of short channel effects (e.g., increase threshold voltage (Vt), reduce punch, etc.) and the effectiveness of the halos is dependent upon the location, concentration, and confinement of the halo dopant. Unfortunately, halos with a relatively high dopant concentration can also cause a corresponding decrease in switching speed and a corresponding increase in drain-to-body junction leakage.

Consequently, field effect transistor structures have been developed that balance the need to reduce the short channel effects exhibited by a scaled device with the need for a faster switching speed. For example, one such field effect transistor structure is asymmetric with respect to halo configuration (e.g., a source-side halo only or, alternatively, a source-side halo with a higher dopant concentration than a drain-side halo) and, optionally, with respect to the source/drain extension configuration (e.g., the source extension can be overlapped to a greater extent by the gate structure than the drain extension and/or the source extension can have a higher dopant concentration than the drain extension). Such an asymmetric field effect transistor structure provides decreased source resistance, increased threshold voltage, decreased off current (Ioff), increased leakage at the source-to-body junction (which causes a corresponding reduction in floating body effects), decreased leakage at the drain-to-body junction, decreased drain-to-gate capacitance and decreased drain-to-body capacitance and, thereby limits short channel effects without decreasing switching speed. Therefore, a number of integrated circuit structures have been designed with all asymmetric field effect transistors in order to optimize performance. Unfortunately, in some circuits and, particularly, in circuits having stacked field effect transistors (i.e., field effect transistors connected in series) performance degradation rather than improvement has been observed. This is because the asymmetric field effect transistor, as described above, also exhibits increased drain resistance due to the relatively low amount of drain extension overlap by the gate structure and/or the relatively low drain dopant concentration. Increased drain resistance degrades the linear drain current (Idlin) (e.g., by as much as 20%). So, with respect to stacked asymmetric field effect transistors, while drive of the first asymmetric field effect transistor in the stack is limited only by relatively low source resistance, drive of each downstream asymmetric field effect transistor is limited by relatively low source resistance and also relatively high drain resistance. Thus, the switching speed of the first asymmetric field effect transistor is relatively fast, but the switching speed of the downstream asymmetric field effect transistor(s) is relatively slow. Consequently, the advantages of incorporating all asymmetric field effect transistors into an integrated circuit structure are outweighed by the disadvantages. Therefore, there is a need in the art for an integrated circuit structure that incorporates both asymmetric and symmetric field effect transistors, balancing the advantages and disadvantages of both in order to optimize overall integrated circuit performance.

In view of the foregoing disclosed herein are embodiments of an integrated circuit structure that incorporates both asymmetric and symmetric field effect transistors, balancing the advantages and disadvantages of both in order to optimize overall integrated circuit performance. Specifically, the embodiments incorporate one or more asymmetric field effect transistors as power gates (i.e., as a footer and/or a header) for an electronic circuit (e.g., for a logic circuit, such as a NAND circuit or a NOR circuit, for an input/output buffer circuit, etc.), which has at least two stacked symmetric field effect transistors. The asymmetric field effect transistor has an asymmetric halo configuration (i.e., a single source-side halo or, alternatively, a source-side halo with a higher dopant concentration than a drain-side halo) and an asymmetric source/drain extension configuration (i.e., the source extension can be overlapped to a greater extent by the gate structure than the drain extension and/or the source extension can have a higher dopant concentration than the drain extension). As a result, the asymmetric field effect transistor has a low off current (i.e., Ioff). In operation as a power gate, the asymmetric field effect transistor is turned off when the electronic circuit is placed in a standby state and, due to the low off current (Ioff), effectively reduces standby leakage current from the electronic circuit. Additionally, avoiding the use of stacked asymmetric field effect transistors within the electronic circuit itself prevents performance degradation due to reduced linear drain current (Idlin).

FIG. 1 illustrates generally the embodiments of an integrated circuit structure 100 according to the present invention. This integrated circuit 100 can comprise an electronic circuit 130, supply voltages (e.g., a positive supply voltage (Vdd) 111 and a negative supply voltage (Vss) 112) for supplying power to the electronic circuit 130 and a P-type asymmetric field effect transistor 121 and/or an N-type asymmetric field effect transistor 122 gating the supply of power to the electronic circuit 130.

Figure 2:
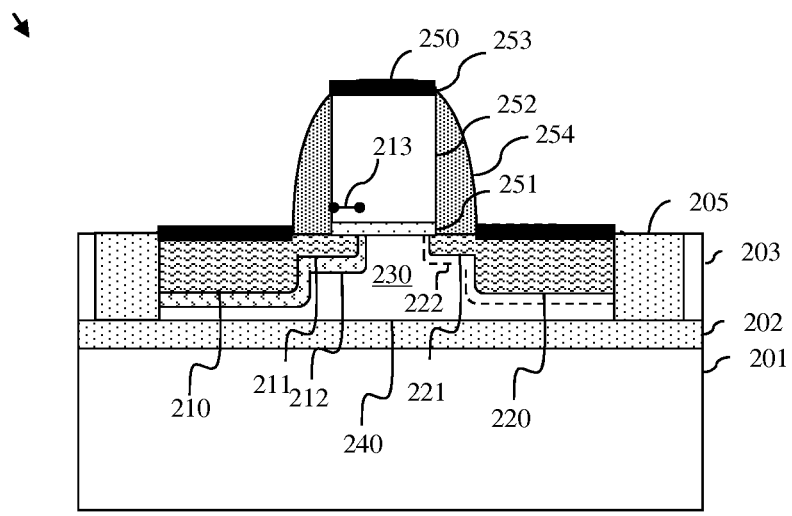
FIG. 2 is a cross-section diagram illustrating an exemplary asymmetric field effect transistor that can be incorporated as a power gate into the integrated circuit structure of FIG. 1.

FIG. 2 is a cross-section diagram illustrating an exemplary asymmetric field effect transistor 121, 122 that can be incorporated into the integrated circuit structure 100. Specifically, this asymmetric field effect transistor can be formed on a semiconductor-on-insulator (SOI) wafer (as shown) comprising a semiconductor substrate 201 (e.g., a silicon substrate or other semiconductor substrate). The SOI wafer can further comprise an insulator layer 202 (e.g., a silicon oxide layer or other suitable insulator layer) on the substrate 201 and a semiconductor layer 203 (e.g., a single crystalline silicon layer or other suitable semiconductor layer) on the insulator layer 202. Trench isolations regions 205 can extend vertically through the semiconductor layer 203 to the insulator layer 202 and can define and electrically isolate the body 240 of the asymmetric field effect transistor. Alternatively, this asymmetric field effect transistor can be formed on a bulk semiconductor wafer (e.g., a bulk silicon wafer).

The asymmetric field effect transistor 121, 122 can further comprise a source 210, a drain 220, a channel 230 positioned laterally between the source 210 and drain 220. Those skilled in the art will recognize that the conductivity type of the source 210, drain 220 and channel 230 will vary depending upon whether the asymmetric transistor is an N-type field effect transistor (NFET) or a P-type field effect transistor (PFET). Specifically, for an NFET 122, the source 210 and drain 220 will be doped with an N-type dopant (e.g., a Group V dopant, such as arsenic (As), phosphorous (P) or antimony (Sb)) and the channel 230 will be doped with a P-type dopant (e.g., a Group III dopant, such as boron (B) or indium (In)) However, for a PFET 121, the source 210 and drain 220 will be doped with a P-type dopant (e.g., a Group III dopant, such as boron (B) or indium (In)) and the channel 230 will be doped with an N-type dopant (e.g., a Group V dopant, such as arsenic (As), phosphorous (P) or antimony (Sb)).

The asymmetric field effect transistor 121, 122 can further comprise a gate structure 250 positioned above the channel 230. The gate structure 250 can comprise a gate dielectric layer 251 (e.g., a gate oxide layer, a high-k gate dielectric layer or other suitable gate dielectric layer) positioned on the top surface of the semiconductor layer 203 above the channel 230. A gate conductor layer 252 (e.g., a metal gate conductor layer, a polysilicon gate conductor layer, a dual work function gate conductor layer or other suitable gate conductor layer) can be positioned on the gate dielectric layer 251. Optionally, a metal silicide layer 253 can be positioned on the gate conductor layer 252. Gate sidewall spacers 254 (e.g., nitride sidewall spacers, oxide sidewall spacers, oxynitride sidewall spacers or other suitable dielectric spacers) can be positioned on opposing sides of the gate structure 250.

The asymmetric field effect transistor 121, 122 can further comprise a source extension 211 extending laterally from the source 210 towards the channel 230 and, on the opposite side of the channel, a drain extension 221 extending laterally from the drain 220 towards the channel 230. The source extension 211 and drain extension 221 can have the same conductivity type as the source 210 and drain 220, respectively (i.e., N-type conductivity for an NFET 122 and P-type conductivity for a PFET 121).

The asymmetric field effect transistor 121, 122 can be asymmetric with respect halo configuration. For example, the asymmetric field effect transistor can have a single halo 212 positioned laterally between the source 210 and the channel 230 (i.e., a source-side only halo). This source-side halo 212 can be a highly doped region having the same conductivity type as the channel 230. For example, in the case of an NFET 122, the halo 212 can have a relatively high concentration of a P-type dopant and the channel 230 can have a relatively low concentration of a P-type dopant; whereas, in the case of a PFET 121, the halo 212 can have a relatively high concentration of an N-type dopant and the channel 230 can have a relatively low concentration of an N-type dopant. Alternatively, the asymmetric field effect transistor 121, 122 can have a first halo 212 positioned laterally between the source and the channel region (i.e., a source-side halo) and a second halo 222 positioned laterally between the drain and said channel region (i.e., a drain-side halo), where the first halo 212 has a higher concentration of the same conductivity type dopant than the second halo 222.

It should be noted that the halo 212 and, if applicable 222, structures as drawn in FIG. 2 are for illustration purposes and is not intended to be limiting. Various other halo structures having different sizes, shapes, locations relative to the source and source extension, etc. are well-known in the art and can be alternatively be incorporated into the asymmetric field effect transistor 121, 122. For example, the halo 212 can border the edges of the source extension 211 and source 210 and, if applicable, halo 222 can border the edges of the drain extension 221 and drain 220, as illustrated in FIG. 2. Alternatively, the halo 212 can border the edge of the source extension 211 only and not the source 210 and, if applicable, halo 222 can border the edges of the drain extension 221 only and not the drain 220. Alternatively, the halo 212 can be positioned below the source extension 211 only and, if applicable, halo 222 can be positioned below the drain extension 221 only.

The asymmetric field effect transistor 121, 122 can also be asymmetric with respect to source/drain extension configuration. Specifically, the gate structure 250 can overlap the source extension 211 and, optionally, the drain extension 221. However, the source extension 211 can be overlapped to a greater extent than the drain extension 221. In other words, the gate structure 250 can overlap the source extension 211 by a distance 213, which is greater than the distance, if any, that the gate structure 250 overlaps the drain extension 221. Additionally or alternatively, the source extension 211 can have a higher dopant concentration than the drain extension 221. For example, in the case of an NFET 122, the source extension 211 can have a relatively high concentration of an N-type dopant and the drain extension 221 can have a relatively low concentration of the N-type dopant; whereas, in the case of a PFET 121, the source extension 211 can have a relatively high concentration of a P-type dopant and the drain extension 221 can have a relatively low concentration of the P-type dopant.

As a result, the asymmetric field effect transistor structure 121, 122 will have decreased source resistance, increased threshold voltage, decreased off current (Ioff), increased leakage at the source-to-body junction, decreased leakage at the drain-to-body junction, decreased drain-to-gate capacitance and decreased drain-to-body capacitance and will, thereby have limited short channel effects without decreased switching speed. Specifically, as a result, a first junction leakage current between the source 210 and the channel 230 will be greater than a second junction leakage current between the drain 220 and the channel 230. Furthermore, a first capacitance between the source 210 and the gate structure 250 will be greater than a second capacitance between the drain 220 and the gate structure 250. Additionally, if the body 240 of the transistor 200 is on an insulator layer 202 surrounded by isolation regions 205 and not contacted (i.e., floating), a third capacitance between the source 210 and the body 240 will be greater than a fourth capacitance between the drain 220 and the body 240.

Referring again to FIG. 1, as mentioned above the integrated circuit 100 can also comprise an electronic circuit 130. The electronic circuit 130 can comprise any electronic circuit having an output node 135 and a plurality of symmetric field effect transistors 131, at least two of which are connected in series and have the same conductivity type as the asymmetric field effect transistor functioning as a power gate.

Figure 3:
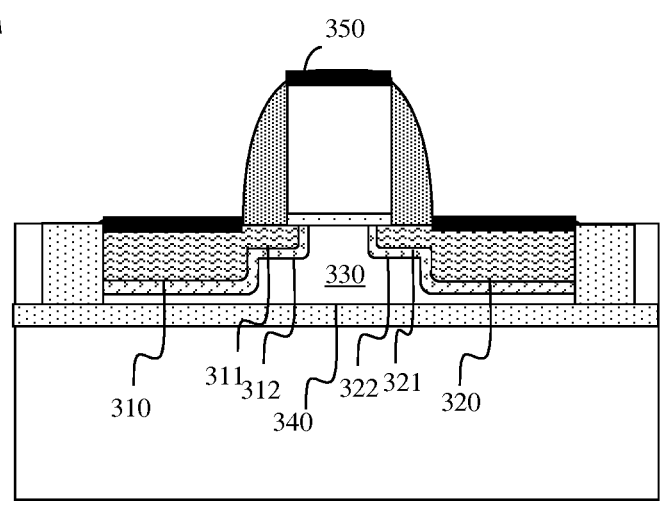
FIG. 3 is a cross-section diagram illustrating an exemplary symmetric field effect transistor that can be incorporated into the electronic circuit of integrated circuit structure of FIG. 1.

FIG. 3 is a cross-section diagram illustrating an exemplary symmetric field effect transistor 131 that can be incorporated into the electronic circuit 130. Specifically, each symmetric field effect transistor 131 can comprise a source 310, a drain 320, a channel 330 positioned laterally between the source 310 and drain 320. Those skilled in the art will recognize that the conductivity type of the source 310, drain 320 and channel 330 will vary depending upon whether transistor 131 is an N-type field effect transistor (NFET) or a P-type field effect transistor (PFET), as discussed in detail above with regard to the asymmetric field effect transistors 121, 122. Each symmetric field effect transistor 131 can further comprise a gate structure 350 positioned above the channel 330. Each symmetric field effect transistor can be symmetric can specifically be symmetric with respect to source/drain extension configuration. For example, optionally, each symmetric field effect transistor 131 can further comprise a source extension 311 extending laterally from the source 310 towards the channel 330 and, on the opposite side of the channel, a drain extension 321 extending laterally from the drain 320 towards the channel 330. The source extension 311 and drain extension 321 can have the same conductivity type as the source 310 and drain 320, respectively and can be symmetric (i.e., can be overlapped by the gate structure 350 to the same extent and can have the same dopant concentration). Each symmetric field effect transistor can also be symmetric with respect to halo configuration. For example, optionally, each symmetric field effect transistor 131 can also comprise halos 312, 322 positioned laterally between the source 310 and the channel 330 and positioned laterally between the drain 320 and the channel 330, respectively. These halos 312, 322 can be highly doped regions having the same conductivity type as the channel 330. Additionally, these halos 312, 322 can be symmetric. That is, they can be essentially the same size, can be located in the same positions relative to the source 310 and drain 320, respectively, can have the same dopant concentration, etc. It should be noted that the symmetric field effect transistor structure 131 as drawn in FIG. 3 is for illustration purposes and is not intended to be limiting. Various other symmetric field effect transistor structures are well-known in the art and can be incorporated into the electronic circuit 130.

Referring to FIGS. 1 and 2 in combination and as mentioned above, the integrated circuit structure 100 can comprise the electronic circuit 130, supply voltages (e.g., a positive supply voltage (Vdd) 111 and a negative supply voltage (Vss) 112) for supplying power to the electronic circuit 130 and a P-type asymmetric field effect transistor 121 and/or an N-type asymmetric field effect transistor 122 gating the supply of power to the electronic circuit 130. For example, a P-type asymmetric field effect transistor 121 can function as header with respect to the positive supply voltage (Vdd) 111. In this case, the source 210 of the P-type asymmetric field effect transistor 122 can be electrically connected to the positive supply voltage (Vdd) 111 and P-type series-connected symmetric field effect transistors 131 within the electronic circuit 130 can be electrically connected between the drain 220 of the P-type asymmetric field effect transistor 121 and the output node 135. Additionally or alternatively, an N-type asymmetric field effect transistor 122 can function as a footer with respect to the negative supply voltage (Vss) 112. In this case, the source 210 of the N-type asymmetric field effect transistor 122 can be electrically connected to the negative supply voltage (Vss) 112 and N-type series-connected symmetric field effect transistors 131 within the electronic circuit 130 can be electrically connected between the drain 220 of the N-type asymmetric field effect transistor 122 and the output node 135. In operation as a power gate, the asymmetric field effect transistor can be turned off when the electronic circuit 130 is placed in a standby state and, due to its relatively low off current (Ioff), can effectively reduce standby leakage current from the electronic circuit 130.

It should be understood that the integrated circuit structure 100 according to the present invention can be implemented with respect to any electronic circuit 130 having an output node 135 and a plurality of symmetric field effect transistors 131, at least two of which are connected in series and have the same conductivity type as the asymmetric field effect transistor. For example, the electronic circuit 130 can comprise a NAND logic (see FIG. 4), a NOR logic circuit (see FIG. 5), an input/output buffer circuit (see FIG. 6), etc. The specific embodiments illustrated in FIGS. 4-6 and described in detail below are provided for illustration purposes and are not intended to be limiting.

Figure 4:
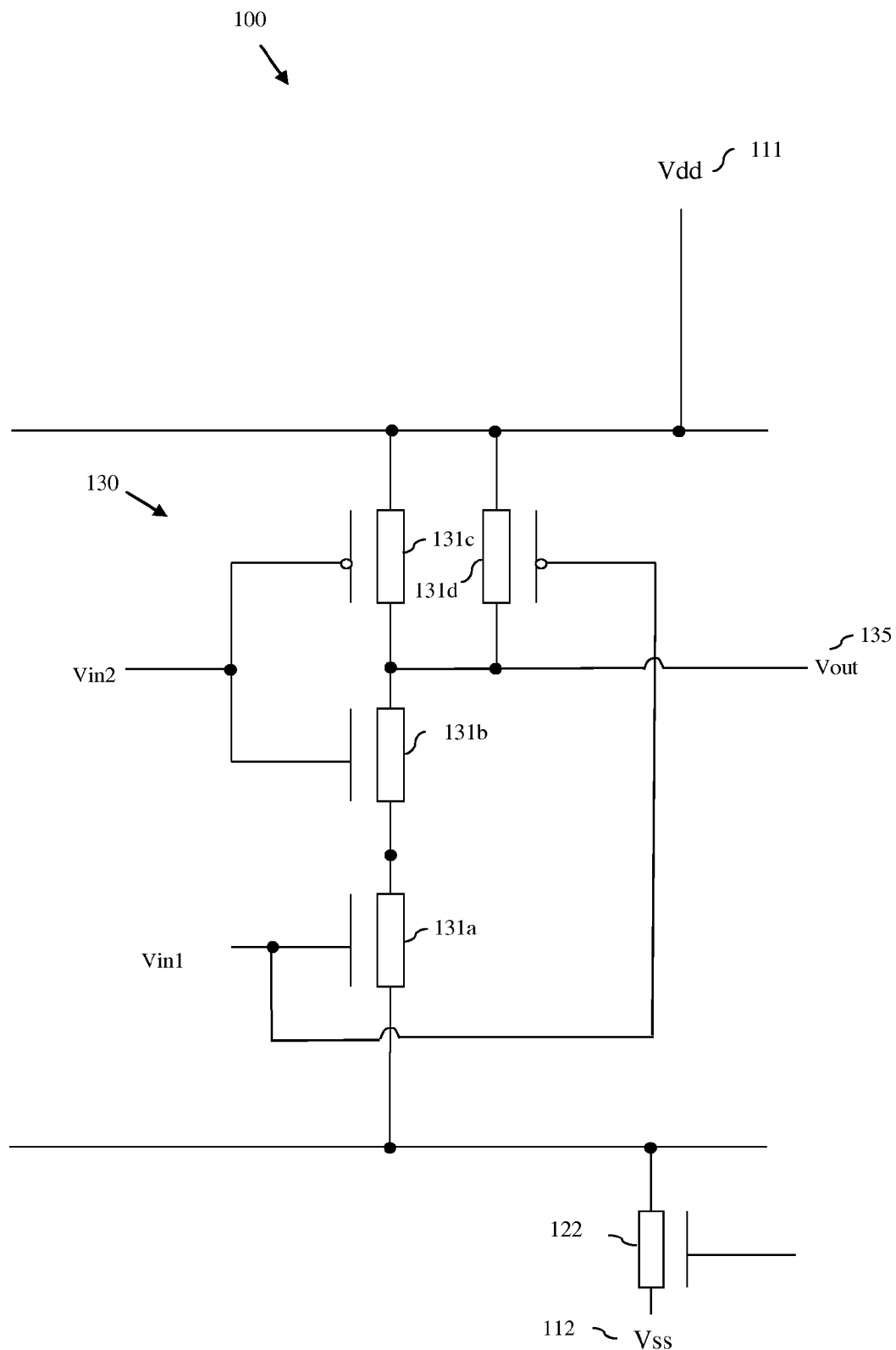
FIG. 4 is a schematic diagram illustrating one embodiment of an integrated circuit structure according to the present invention.

Referring to FIG. 4, one exemplary embodiment of this integrated circuit structure 100 can comprise at least an electronic circuit 130, a positive supply voltage (Vdd) 111 and a negative supply voltage (Vss) 112 for supply power to the electronic circuit 130, and an N-type asymmetric field effect transistor 122 functioning as a footer for gating the supply of power to the electronic circuit 130. The N-type asymmetric field effect transistor 122 can be configured as described in detail above and illustrated in FIG. 2. In this case, the electronic circuit 130 can specifically comprise a logic circuit, having an output node 135 and a plurality of symmetric field effect transistors 131a-d (e.g., as illustrated in FIG. 3 and described in detail above), where at least two of the symmetric field effect transistors 131a-b are N-type and connected in series.

For example, the logic circuit can comprise NAND circuit. In this NAND circuit, there can be two voltage input nodes (Vin1) and (Vin2) and an output node 135. Additionally, two N-type symmetric field effect transistors 131a-b are connected in series with the source of the first N-type symmetric field effect transistor 131a connected to the negative supply voltage (Vss) 112 and the drain of the second N-type symmetric field effect transistor 131b connected to the output node 135. Two P-type symmetric field effect transistors 131c-d are connected in parallel with the sources of each P-type symmetric field effect transistor 131c-d being connected to the positive supply voltage (Vdd) 111 and with the drains of each of the P-type symmetric field effect transistor being connected to the output node 135. The gates of the N-type symmetric field effect transistor 131a and the P-type symmetric field effect transistor 131d can be controlled by the same voltage input (Vin1) and the gates of the N-type symmetric field effect transistor 131b and the P-type symmetric field effect transistor 131c can be controlled by another voltage input (Vin2).

The N-type asymmetric field effect transistor 122 can be inserted between the negative supply voltage (Vss) 112 and the N-type series-connected symmetric field effect transistors 131a-b to function as a footer, gating the supply of power to the NAND circuit. Specifically, the source 210 of the N-type asymmetric field effect transistor 122 can be electrically connected to the negative supply voltage (Vss) 112 and the N-type series-connected symmetric field effect transistors 131a-b can be electrically connected between the drain 220 of the N-type asymmetric field effect transistor 122 and the output node 135.

In operation as a power gate, the N-type asymmetric field effect transistor 122 can be turned off when the NAND circuit 130 is placed in a standby state and, due to its relatively low off current (Ioff), can effectively reduce standby leakage current from the NAND circuit. Additionally, avoiding the use of stacked asymmetric field effect transistors within the NAND circuit itself prevents performance degradation due to reduced linear drain current (Idlin).

Figure 5:
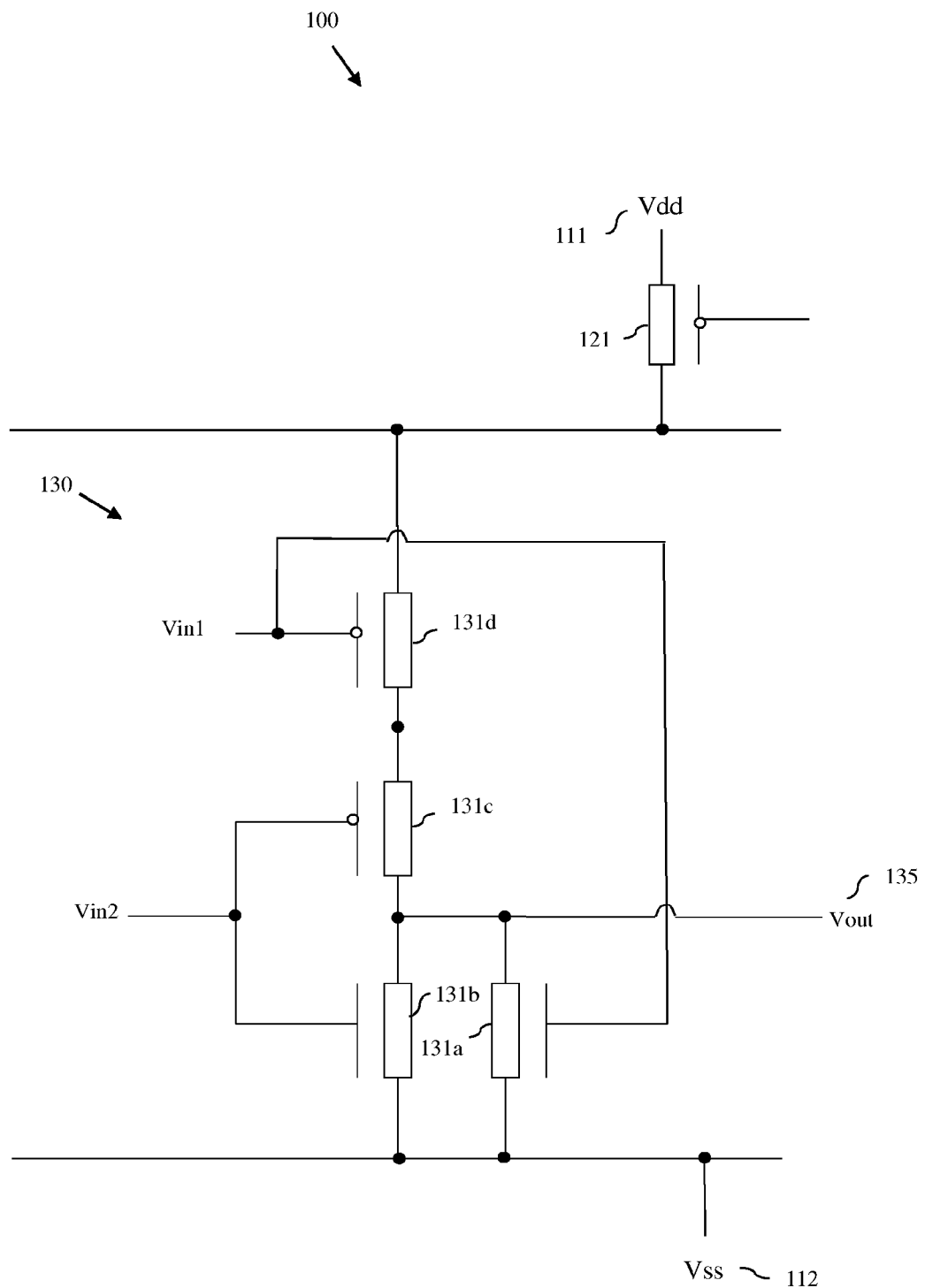
FIG. 5 is a schematic diagram illustrating another embodiment of an integrated circuit structure according to the present invention.

Referring to FIG. 5, another exemplary embodiment of this integrated circuit structure 100 can comprise at least an electronic circuit 130, a positive supply voltage (Vdd) 111 and a negative supply voltage (Vss) 112 for supply power to the electronic circuit 130, and a P-type asymmetric field effect transistor 121 for gating the supply of power to the electronic circuit 8130. The P-type asymmetric field effect transistor 121 can be configured as described in detail above and illustrated in FIG. 2. In this case, the electronic circuit 130 can specifically comprise a logic circuit, having an output node 135 and a plurality of symmetric field effect transistors 131a-d (e.g., as illustrated in FIG. 3 and described in detail above), where at least two of the symmetric field effect transistors 131c-d are P-type and connected in series.

For example, the logic circuit can comprise a NOR circuit. In this NOR circuit, there can be two voltage input nodes (Vin1) and (Vin2) and an output node 135. Additionally, two P-type symmetric field effect transistors 131c-d are connected in series with the source of the first P-type symmetric field effect transistor 131d connected to the positive supply voltage (Vdd) 111 and the drain of the second P-type symmetric field effect transistor 131c connected to the output node 135. Two N-type symmetric field effect transistors 131a-b are connected in parallel with the sources of each N-type symmetric field effect transistor 131a-b being connected to the negative supply voltage (Vss) 112 and with the drains of each of the N-type symmetric field effect transistors being connected to the output node 135. The gates of the N-type symmetric field effect transistor 131a and the P-type symmetric field effect transistor 131d can be controlled by the same voltage input (Vin1) and the gates of the N-type field effect transistor 131b and the P-type field effect transistor 131c can be controlled by another voltage input (Vin2).

The P-type asymmetric field effect transistor 121 can be inserted between the positive supply voltage (Vdd) 111 and the P-type series-connected symmetric field effect transistors 131c-d to function as a header, gating the supply of power to the NOR circuit. Specifically, the source 210 of the P-type asymmetric field effect transistor 121 can be electrically connected to the positive supply voltage (Vdd) 111 and the P-type series-connected symmetric field effect transistors can be electrically connected between the drain 220 of the P-type asymmetric field effect transistor 121 and the output node 135.

In operation as a power gate, the P-type asymmetric field effect transistor 121 can be turned off when the NOR circuit 130 is placed in a standby state and, due to its relatively low off current (Ioff), can effectively reduce standby leakage current from the NOR circuit. Additionally, avoiding the use of stacked asymmetric field effect transistors within the NOR circuit itself prevents performance degradation due to reduced linear drain current (Idlin).

Figure 6:
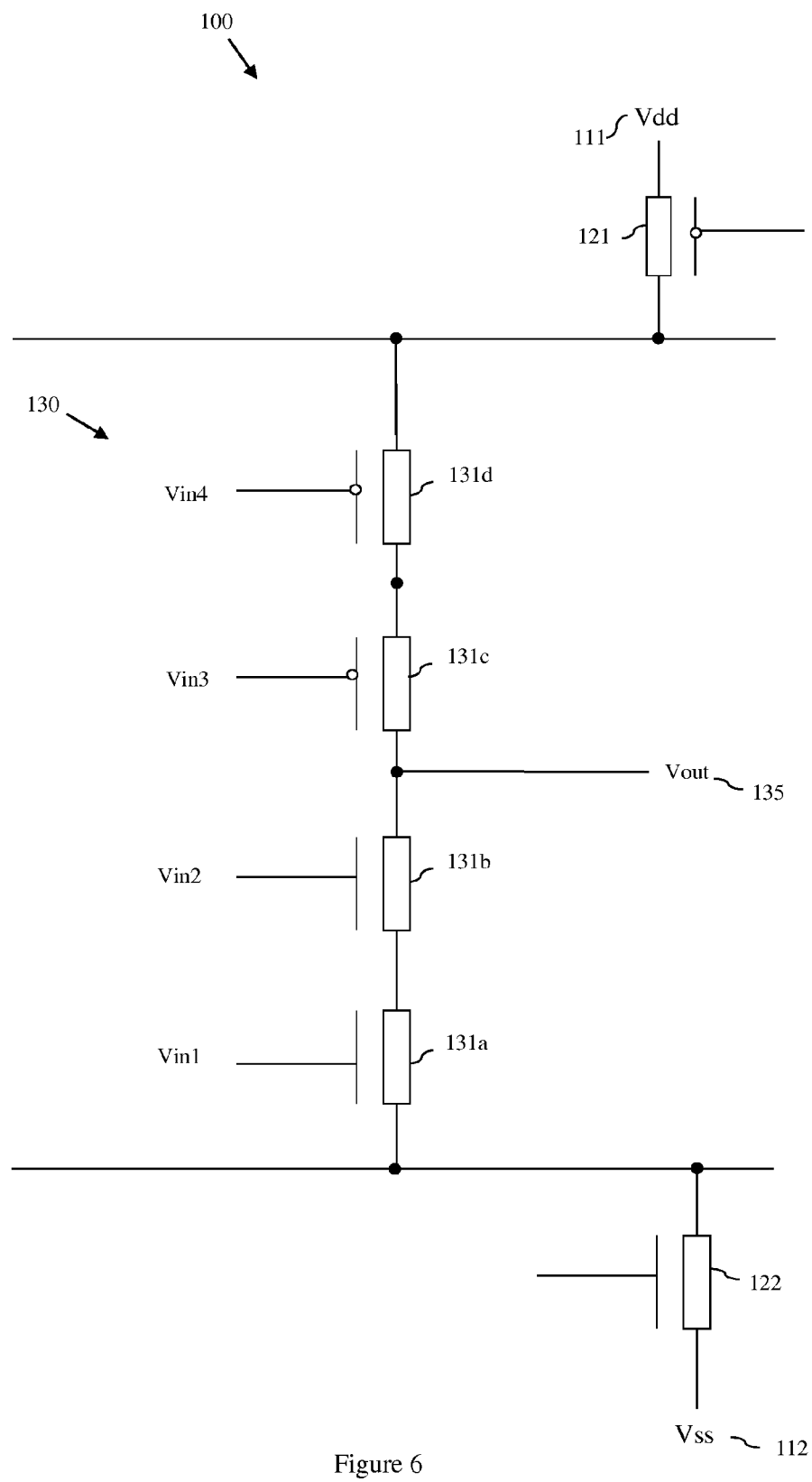
FIG. 6 is a schematic diagram illustrating yet another embodiment of an integrated circuit structure according to the present invention.

Referring to FIG. 6, yet another exemplary embodiment of this integrated circuit structure 100 can comprise at least an electronic circuit 130, a positive supply voltage (Vdd) 111 and a negative supply voltage (Vss) 112 for supply power to the electronic circuit 130, and a P-type asymmetric field effect transistor 121 and an N-type asymmetric field effect transistors 122 for gating the supply of power to the electronic circuit 130. The P-type asymmetric field effect transistor 121 and the N-type asymmetric field effect transistor can each be configured as described in detail above and illustrated in FIG. 2. In this case, the electronic circuit 130 can specifically comprise any electronic circuit, having an output node 135 and a plurality of symmetric field effect transistors 131a-d (e.g., as illustrated in FIG. 3 and described in detail above), where at least two of the symmetric field effect transistors are N-type and connected in series (e.g., 131a-b) and at least two of the symmetric field effect transistors are P-type and connected in series (e.g., 131c-d).

For example, the electronic circuit 130 can comprise an input/output buffer circuit. In this input/output buffer circuit, there can be four voltage input nodes (Vin1)-(Vin4) and an output node 135. Additionally, two P-type symmetric field effect transistors 131c-d are connected in series with the source of the first P-type symmetric field effect transistor 131d connected to the positive supply voltage (Vdd) 111 and the drain of the second P-type symmetric field effect transistor 131c connected to the output node 135. Two N-type symmetric field effect transistors 131a-b are also connected in series with the source of the first N-type symmetric field effect transistor 131a being connected to the negative supply voltage (Vss) 112 and with the drain of the second N-type symmetric field effect transistor 131b being connected to the output node 135. The gates these symmetric field effect transistors 131a-d can be controlled by different input voltages (Vin1)-(Vin4), respectively.

In operation as power gates, the P-type asymmetric field effect transistor 121 and the N-type asymmetric field effect transistors 122 can be turned off when the input/output buffer circuit 130 is placed in a standby state and, due to their relatively low off currents (Ioff), can effectively reduce standby leakage current from the input/output buffer circuit. Additionally, avoiding the use of stacked asymmetric field effect transistors (e.g., either P-type or N-type) within the input/output buffer circuit itself prevents performance degradation due to reduced linear drain current (Idlin).

The integrated circuit structure as described above can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit structure chips, ranging from toys and other low-end applications to advanced computer products having a display, a keyboard or other input device, and a central processor.

It should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it should be understood that corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments of an integrated circuit structure that incorporates both asymmetric and symmetric field effect transistors, balancing the advantages and disadvantages of both in order to optimize overall integrated circuit performance. Specifically, the embodiments incorporate one or more asymmetric field effect transistors as power gates (i.e., as a footer and/or a header) for an electronic circuit (e.g., for a logic circuit, such as a NAND circuit or a NOR circuit, for an input/output buffer circuit, etc.), which has at least two stacked symmetric field effect transistors. The asymmetric field effect transistor has an asymmetric halo configuration (i.e., a single source-side halo or a source-side halo with a higher dopant concentration than a drain-side halo) and an asymmetric source/drain extension configuration (i.e., the source extension can be overlapped to a greater extent by the gate structure than the drain extension and/or the source extension can have a higher dopant concentration than the drain extension). As a result, the asymmetric field effect transistor has a low off current (i.e., Ioff). In operation as a power gate, the asymmetric field effect transistor is turned off when the electronic circuit is placed in a standby state and, due to the low off current (Ioff), effectively reduces standby leakage current from the electronic circuit. Additionally, avoiding the use of stacked asymmetric field effect transistors within the electronic circuit itself prevents performance degradation due to reduced linear drain current (Idlin).

What is claimed is:

1. An integrated circuit structure comprising:
   a supply voltage;
   an electronic circuit; and
   a power gate electrically connected between said supply voltage and said electronic circuit,
   said power gate gating a supply of power from said supply voltage to said electronic circuit,
   said power gate comprising an asymmetric field effect transistor comprising a source and a drain, said source being electrically connected to said supply voltage, said electronic circuit comprising a plurality of symmetric field effect transistors and an output node, said plurality of symmetric field effect transistors comprising at least a first symmetric field effect transistor and a second symmetric field effect transistor, said asymmetric field effect transistor, said first symmetric field effect transistor, and said second symmetric field effect transistor all having a same type conductivity, and said asymmetric field effect transistor, said first symmetric field effect transistor, said second symmetric field effect transistor and said output node being electrically connected in series such that said first symmetric field effect transistor is connected in series between and directly to said asymmetric field effect transistor and said second symmetric field effect transistor.

2. The integrated circuit structure of claim 1, said asymmetric field effect transistor further comprising:
- a channel positioned laterally between said source and said drain;
- a source extension extending laterally from said source towards said channel;
- a drain extension extending laterally from said drain towards said channel;
- a gate structure above said channel; and
- at least one of the following:
  - a single halo positioned laterally between said source and said channel;
  - a first halo positioned laterally between said source and said channel and a second halo positioned laterally between said drain and said channel, said first halo having a higher dopant concentration than said second halo; and
  - said gate structure overlapping said source extension by a greater distance than said drain extension.

3. The integrated circuit structure of claim 2, said source extension having a higher concentration of a dopant having a given conductivity type than said drain extension.

4. The integrated circuit structure of claim 2, wherein, within said asymmetric field effect transistor,
- a first junction leakage current between said source and said channel is greater than a second junction leakage current between said drain and said channel; and
- a first capacitance between said source and said gate structure is greater than a second capacitance between said drain and said gate structure.

5. The integrated circuit structure of claim 2, said source, said drain and said channel being positioned within a floating body on an insulator layer and surrounded laterally by a trench isolation region, wherein a third capacitance between said source and said body is greater than a fourth capacitance between said drain and said body.

6. An integrated circuit structure comprising:
- a negative supply voltage (Vss);
- an electronic circuit; and
- a footer electrically connected between said negative supply voltage (Vss) and said electronic circuit,
- said footer gating a supply of power from said negative supply voltage (Vss) to said electronic circuit,
- said footer comprising an N-type asymmetric field effect transistor comprising a source and a drain, said source being electrically connected to said negative supply voltage (Vss),
- said electronic circuit comprising a plurality of symmetric field effect transistors and an output node,
- said plurality of symmetric field effect transistors comprising at least a first N-type symmetric field effect transistor and a second N-type symmetric field effect transistor, and
- said N-type asymmetric field effect transistor, said first N-type symmetric field effect transistor, said second N-type symmetric field effect transistor and said output node being electrically connected in series such that said first N-type symmetric field effect transistor is connected in series between and directly to said N-type asymmetric field effect transistor and said second N-type symmetric field effect transistor.

7. The integrated circuit structure of claim 6, further comprising a positive supply voltage (Vdd) and said electronic circuit comprising a NAND logic circuit further comprising at least two P-type symmetric field effect transistors connected in parallel between said positive supply voltage (Vdd) and said output node.

8. The integrated circuit structure of claim 6, said asymmetric field effect transistor further comprising:
- a channel positioned laterally between said source and said drain;
- a source extension extending laterally from said source towards said channel;
- a drain extension extending laterally from said drain towards said channel;
- a gate structure above said channel; and
- at least one of the following:
  - a single halo positioned laterally between said source and said channel;
  - a first halo positioned laterally between said source and said channel and a second halo positioned laterally between said drain and said channel, said first halo having a higher dopant concentration than said second halo; and
  - said gate structure overlapping said source extension by a greater distance than said drain extension.

9. The integrated circuit structure of claim 8, said source extension having a higher concentration of a dopant having a given conductivity type than said drain extension.

10. The integrated circuit structure of claim 8, wherein, within said asymmetric field effect transistor,
- a first junction leakage current between said source and said channel is greater than a second junction leakage current between said drain and said channel; and
- a first capacitance between said source and said gate structure is greater than a second capacitance between said drain and said gate structure.

11. The integrated circuit structure of claim 8, said source, said drain and said channel being positioned within a floating body on an insulator layer and surrounded laterally by a trench isolation region, wherein a third capacitance between said source and said body is greater than a fourth capacitance between said drain and said body.

12. An integrated circuit structure comprising:
- a positive supply voltage (Vdd);
- an electronic circuit; and
- a header gating a supply of power from said positive supply voltage (Vdd) to said electronic circuit,
- said header comprising a P-type asymmetric field effect transistor comprising a source and a drain, said source being electrically connected to said positive supply voltage (Vdd),
- said electronic circuit comprising a plurality of symmetric field effect transistors and an output node, said plurality of symmetric field effect transistors comprising at least a first P-type symmetric field effect transistor and a second P-type symmetric field effect transistor, said P-type asymmetric field effect transistor, said first P-type symmetric field effect transistor, said second P-type symmetric field effect transistor, and said output node being electrically connected in series such that said first P-type symmetric field effect transistor is connected in series between and directly to said P-type asymmetric field effect transistor and said second P-type symmetric field effect transistor.

13. The integrated circuit structure of claim 12, further comprising a negative supply voltage (Vss) and said electronic circuit comprising a NOR logic circuit further comprising at least two N-type symmetric field effect transistors connected in parallel between said negative supply voltage (Vss) and said output node.

14. The integrated circuit structure of claim 12, said asymmetric field effect transistor further comprising:
- a channel positioned laterally between said source and said drain;
- a source extension extending laterally from said source towards said channel;
- a drain extension extending laterally from said drain towards said channel;
- a gate structure above said channel; and
- at least one of the following:
  - a single halo positioned laterally between said source and said channel;
  - a first halo positioned laterally between said source and said channel and a second halo positioned laterally between said drain and said channel, said first halo having a higher dopant concentration than said second halo; and
  - said gate structure overlapping said source extension by a greater distance than said drain extension.

15. The integrated circuit structure of claim 14, said source extension having a higher concentration of a dopant having a given conductivity type than said drain extension.

16. The integrated circuit structure of claim 14, wherein, within said asymmetric field effect transistor,
- a first junction leakage current between said source and said channel is greater than a second junction leakage current between said drain and said channel; and
- a first capacitance between said source and said gate structure is greater than a second capacitance between said drain and said gate structure.

17. The integrated circuit structure of claim 14, said source, said drain and said channel being positioned within a floating body on an insulator layer and surrounded laterally by a trench isolation region, wherein a third capacitance between said source and said body is greater than a fourth capacitance between said drain and said body.

18. An integrated circuit structure comprising:
- a positive supply voltage (Vdd);
- a negative supply voltage (Vss);
- an electronic circuit;
- a header gating a first supply of power from said positive supply voltage (Vdd) to said electronic circuit, said header comprising a P-type asymmetric field effect transistor comprising a first source and a first drain, said first source being electrically connected to said positive supply voltage (Vdd); and
- a footer gating a second supply of power from said negative supply voltage (Vss) to said electronic circuit, said footer comprising an N-type asymmetric field effect transistor comprising a second source and a second drain, said second source being electrically connected to said negative supply voltage (Vss), said electronic circuit comprising a plurality of symmetric field effect transistors and an output node, said plurality of symmetric field effect transistors comprising at least:
- a first P-type symmetric field effect transistor and a second P-type symmetric field effect transistor, said P-type asymmetric field effect transistor, said first P-type symmetric field effect transistor, said second P-type symmetric field effect transistor and said output node being electrically connected in series such that said first P-type symmetric field effect transistor is connected in series between and directly to said P-type asymmetric field effect transistor and said second P-type symmetric field effect transistor; and
- a first N-type symmetric field effect transistor and a second N-type symmetric field effect transistor, said N-type asymmetric field effect transistor, said first N-type symmetric field effect transistor, said second N-type symmetric field effect transistor and said output node being electrically connected in series such that said first N-type symmetric field effect transistor is connected in series between and directly to said N-type asymmetric field effect transistor and said second N-type symmetric field effect transistor.

19. The integrated circuit structure of claim 18, said electronic circuit comprising an input/output buffer.

20. The integrated circuit structure of claim 18, said P-type asymmetric field effect transistor and said N-type asymmetric field effect transistor each further comprising:
- a source extension;
- a drain extension;
- a channel positioned laterally between said source extension and said drain extension;
- a gate structure above said channel; and
- at least one of the following:
  - a single halo positioned laterally between said source and said channel;
  - a first halo positioned laterally between said source and said channel and a second halo positioned laterally between said drain and said channel, said first halo having a higher dopant concentration than said second halo;
  - said gate structure overlapping said source extension by a greater distance than said drain extension; and
  - said source extension having a higher concentration of a dopant having a given conductivity type than said drain extension.

\* \* \* \* \*